US009813230B2

(12) United States Patent
Nee et al.

(10) Patent No.: US 9,813,230 B2
(45) Date of Patent: **\*Nov. 7, 2017**

(54) METHOD AND APPARATUS FOR CANCELLATION OF INTERFERENCE FROM A SPREAD SPECTRUM PHASE LOCK LOOP

(71) Applicant: Entropic Communications, LLC, Carlsbad, CA (US)

(72) Inventors: Chi-ping Nee, Santee, CA (US); Branislav Petrovic, La Jolla, CA (US)

(73) Assignee: ENTROPIC COMMUNICATIONS, LLC, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/207,254

(22) Filed: Jul. 11, 2016

(65) Prior Publication Data

US 2017/0012768 A1 Jan. 12, 2017

Related U.S. Application Data

(63) Continuation of application No. 14/295,873, filed on Jun. 4, 2014, now Pat. No. 9,391,658.

(60) Provisional application No. 61/982,827, filed on Apr. 22, 2014.

(51) Int. Cl.
| | |
|---|---|
| *H04B 1/00* | (2006.01) |
| *H04L 7/033* | (2006.01) |
| *H04B 1/12* | (2006.01) |
| *H04B 1/69* | (2011.01) |
| *H04B 15/04* | (2006.01) |
| *H03L 7/18* | (2006.01) |

(52) U.S. Cl.
CPC .............. *H04L 7/0331* (2013.01); *H03L 7/18* (2013.01); *H04B 1/12* (2013.01); *H04B 1/69* (2013.01); *H04B 15/04* (2013.01)

(58) Field of Classification Search
CPC ......... H04L 7/0331; H03L 7/18; H04B 15/04; H04B 1/12; H04B 1/69
See application file for complete search history.

(56) References Cited

U.S. PATENT DOCUMENTS

| | | | | | |
|---|---|---|---|---|---|
| 5,576,976 | A | * | 11/1996 | White | .................. H03H 17/025 333/17.1 |
| 5,768,166 | A | * | 6/1998 | Palatnik | ............. H03H 17/0202 708/322 |
| 5,832,027 | A | * | 11/1998 | Ishigaki | .................. H03D 3/00 375/149 |

(Continued)

OTHER PUBLICATIONS

International Search Report and Written Opinion for PCT/US15/26776, dated Aug. 24, 2015 (8 pages).

*Primary Examiner* — Erin File
(74) *Attorney, Agent, or Firm* — McAndrews, Held & Malloy, Ltd.

(57) ABSTRACT

Systems and methods for provided for reducing interference caused by leakage of signals generated by a spread spectrum phase lock loop (SS PLL). Output of SS PLL may be processed to reduce interference. For example, a sinusoidal spreading signal may be used to spread the output of the SS PLL. A notch filter tracks the frequency of the output of the SS PLL to steer the notch in the filter to the instantaneous frequency output from the SS PLL, thus allowing the notch filter to be placed in the path of signals that have unwanted leakage from the SS PLL.

20 Claims, 4 Drawing Sheets

(56) References Cited

U.S. PATENT DOCUMENTS

| | | | |
|---|---|---|---|
| 2010/0092183 A1* | 4/2010 | Kim | H04B 10/2575 398/183 |
| 2010/0219876 A1* | 9/2010 | Popescu | H04B 1/1036 327/361 |
| 2010/0259437 A1* | 10/2010 | Dixon | G01S 19/21 342/16 |
| 2013/0207741 A1* | 8/2013 | Presti | H03H 7/48 333/111 |
| 2013/0259102 A1* | 10/2013 | Gudem | H04B 1/3805 375/219 |
| 2014/0362892 A1* | 12/2014 | Richley | G06K 7/10227 375/148 |
| 2015/0304100 A1* | 10/2015 | Nee | H04B 1/12 375/130 |

* cited by examiner

METHOD AND APPARATUS FOR CANCELLATION OF INTERFERENCE FROM A SPREAD SPECTRUM PHASE LOCK LOOP

CLAIM OF PRIORITY

This application is a continuation of U.S. patent application Ser. No. 14/295,873 filed Jun. 4, 2014, which in turn claims priority from U.S. Provisional Patent Application Ser. No. 61/982,827, filed Apr. 22, 2014. Each of the above identified applications is hereby incorporated herein by reference in its entirety.

TECHNICAL FIELD

The disclosed method and apparatus relate to phase lock loops and more particular to a method and apparatus for cancelling interference caused by leakage from a spread spectrum phase lock loop.

BACKGROUND

Phase lock loops are commonly used in many devices today. Phase lock loops generate a signal having a desired frequency. Accordingly, receivers require phase lock loops to generate signals on which information is modulated. Furthermore, circuits that have timing requirements require clocks that are generated by phase lock loops.

One problem that arises when phase lock loops are used is that spurious signals are generated by the phase lock loop and coupled to other nearby circuits. Such spurious signals interfere with the operation of the other circuits. One example of a system in which spurious signals are induced in circuits that lie relatively close to a phase lock loop is a transceiver having a compactly integrated circuit. In such cases, it is common for phase lock loops to generate energy that is induced into the transmit and receive path of the transceiver. In particular, the receive path of a transceiver is vulnerable to interference from energy that leaks from phase lock loops to the receive path.

One way to deal with the interference from phase lock loops is to spread the energy generated in the output of the phase lock loop over a relatively wide frequency spectrum. By spreading the energy across a broadband frequency spectrum, the amount of energy that is present at narrower frequency bands, such as the frequency at which the transceiver receives signals transmitted by other transceivers, is reduced. In order to evenly distribute the frequency of the phase lock loop over a broad spectrum of frequencies, a sawtooth or triangular spreading signal is used as a spreading signal. That is, a signal that ramps at a constant rate can be used to spread the signal output from the phase lock loop evenly over a relatively broad frequency spectrum.

FIG. 1 is an illustration of a spread spectrum phase lock loop 100. A frequency source 102 provides a reference for the operation of the phase lock loop 100. The frequency source 102 is typically a crystal oscillator or other such stable frequency source. The frequency source 102 is coupled to a phase detector 104. The phase detector 104 has an output that represents the difference in phase between the output of a divider 106 and the frequency source 102. The output of the phase detector 104 is a control voltage that is coupled to a low pass filter 108. The low pass filter 108 is designed to provide the phase lock loop with a sufficiently fast response time that the loop can converge, but not so fast that the loop will overshoot and go into oscillation. The output of the low pass filter 308 is coupled to a voltage controlled oscillator (VCO) 110. The output of the low pass filter 108 attempts to steer the output frequency of the VCO 110 to a frequency that will cause the error signal from the phase detector 104 to be zero. Accordingly, the VCO 110 outputs a frequency that is N times the frequency source, where N is the value by which the divider 106 divides the output of the VCO 110 before providing a signal to the phase detector 104. The output of the VCO 100 is coupled to the output port of the phase lock loop 100. In addition, the output of the divider is fed back to the phase detector 104 to allow the phase detector 104 to produce the control voltage to the VCO 110.

In a spread spectrum phase lock loop such as that shown in FIG. 1, the divider 106 is programmable with a variable value that is input from a triangle wave generator 112. The triangle wave generator 112 loads the divider with a value N that increases in even steps up from a minimum value to a maximum value and then back down again in equal steps. Accordingly, the output of the phase lock loop 100 will start at a frequency that is N times the frequency of the source 102 and increases in frequency with increases in the value of N until it hits the maximum frequency. The frequency output from the phase lock loop 100 then decreases from the maximum to the minimum in equal frequency steps. By making the steps equal the frequency moves smoothly across the frequency spectrum spreading the energy equally over the frequency spectrum.

In some systems that are particularly sensitive to the need to reduce the interference from internal phase lock loops, simply spreading the energy generated by the phase lock loop is not sufficient to mitigate the interference caused by the phase lock loop. In these cases, it is desirable to also provide a filter that can further reduce the power of the interfering spurious signals generated as a byproduct of the phase lock loop. Since the frequency generated by the phase lock loop is spread over a relatively broad frequency spectrum, it is not possible to simply put the interference laden received signal through a filter. Such a filter would impede the passage of the desired received signals as well as the interfering signals generated by the phase lock loop.

Therefore, there is a need for a method and apparatus that can generate frequencies in a way that will not interfere with the operation of circuits near the phase lock loop.

SUMMARY

Various embodiments of the disclosed method and apparatus for reducing interference generated by leakage of a nearby phase lock loop are presented. In one embodiment, a signal is generated that allows a tunable notch filter to track the output of the phase lock loop creating the interference. Some of these embodiments are directed toward systems and methods for spreading the output of a phase lock loop with a sinusoidal spreading signal. The use of a sinusoidal spreading signal allows the output frequency of the phase lock loop to be easily tracked, despite the characteristics of a low pass filter within a phase lock loop. Because the frequency of the signal at the output of the phase lock loop can be easily tracked, a tunable notch filter can be used to reduce interference in sensitive circuits, such as the receive chain within a transceiver. The tunable notch filter is provided with the frequency of the sinusoidal signal used to spread the output of the phase lock loop. The tunable notch filter can then track the output frequency of the phase lock loop, reducing the interference generated by the signals output from the phase lock loop.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 1:
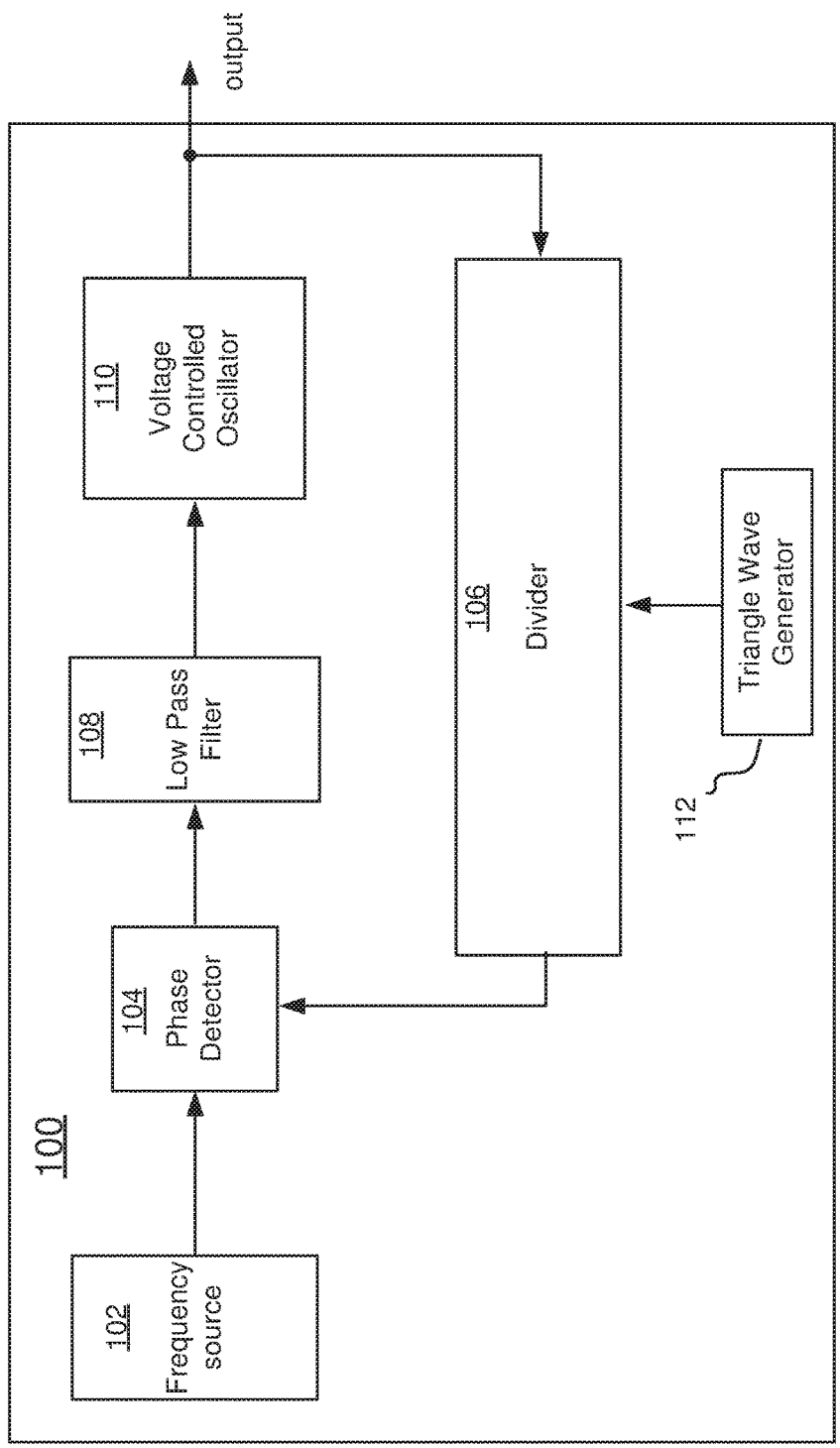
FIG. 1 is an illustration of a phase lock loop.
Figure 2:
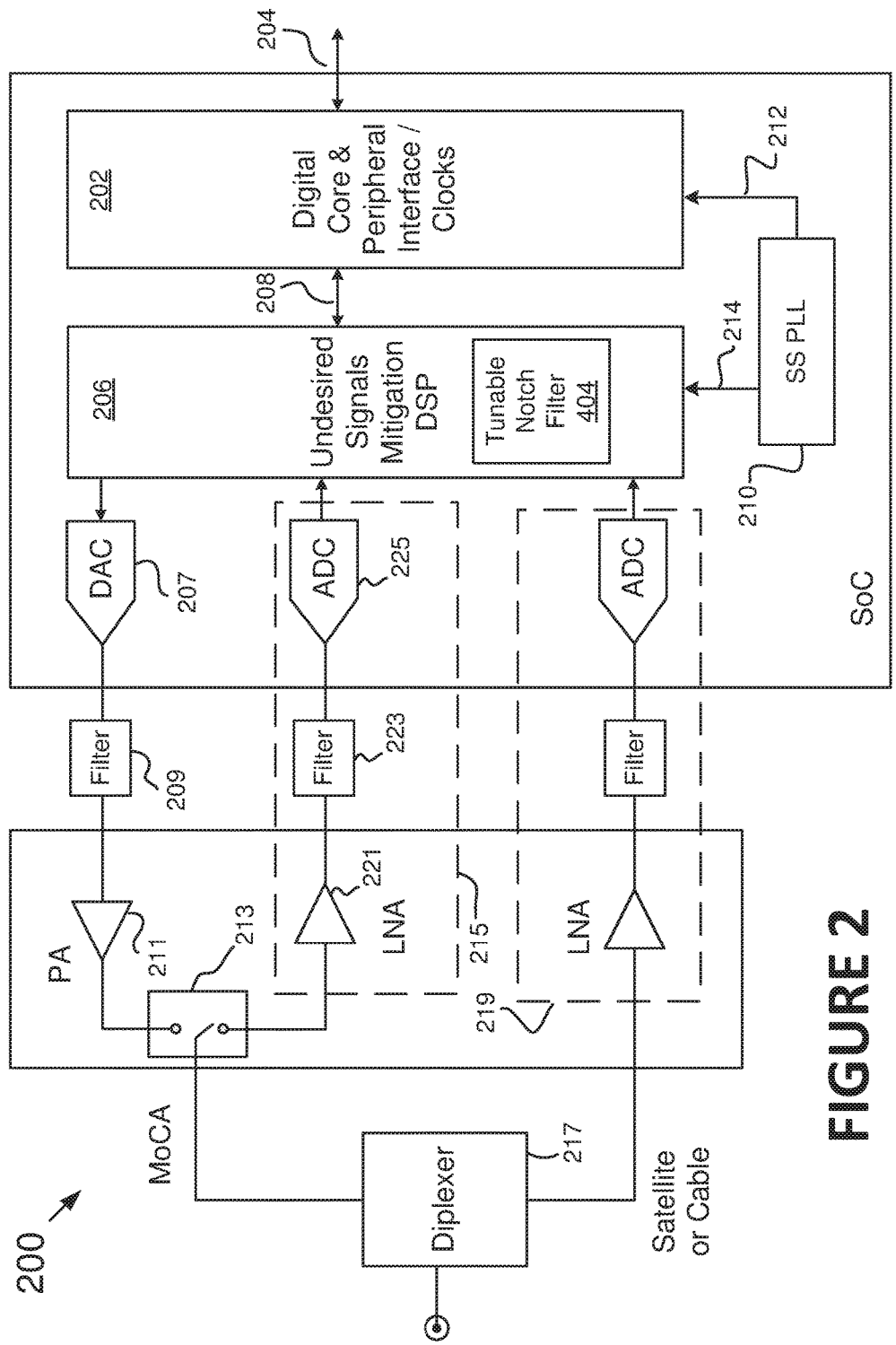
FIG. 2 is a simplified block diagram of a transceiver in accordance with one embodiment of the disclosed method and apparatus.

FIG. 2 is a simplified block diagram of a transceiver 200 in accordance with one embodiment of the disclosed method and apparatus. In one embodiment of the disclosed method and apparatus, the transceiver is used in a set top box. In one such embodiment, the set top box is capable of communicating in accordance with the well-known Multi-media over Coax Alliance (MoCA) standard for broadband communications over coaxial cable. The transceiver has a MoCA transmit chain that includes a digital core 202, a undesired signal mitigation digital signal processor (DSP) 206, a digital to analog converter (DAC) 207, a filter 209 and a power amplifier 211. A transmit/receive switch 213 allows selection between the transmit chain and a MoCA front end section 215. Signals are received in a diplexer 217. The signals are coupled from the diplexer 217 to a MoCA front end section 215 comprising an INA 221, filter 223 and ADC 25. The output from the front end section 215 is coupled to a undesired signals mitigation digital signal processor (DSP) 206. The diplexer 217 is also coupled to a satellite receive front end 219. The DSP 206 reduces the interference of spurious signals that are coupled by leakage from internal phase lock loops onto the received signals. The output from the DSP 206 is provided to a digital core 202 that communicates with external devices over one or more protocols or network interfaces, such as High-Definition Multimedia Interface (HDMI), Universal Serial Bus (USB), Ethernet, Double Data Rate (DDR), Flash, Reduced Gigabit Media Independent Interface (RGMII), etc. Those skilled in the art will understand that the digital core is essentially a conventional component of a transceiver.

A spread spectrum phase lock loop (SS PLL) 210 generates a spread spectrum signal 212. In one embodiment of the disclosed method and apparatus, the spread spectrum signal 212 is used for several purposes throughout the transceiver 200. In one embodiment, the signal 212 is coupled to circuits within the digital core 202. Use of such SS PLLs are well known. When such SS PLLs 210 are used in a compactly integrated circuit, the spread spectrum PLL's tone can easily leak into other parts of the system, such as circuits in the receive path. Such leakage can interfere with these other circuits. The SS PLL 210 provides frequency spreading information on a frequency spreading signal 214 to the DSP 206. Accordingly, the DSP 206 can use the information regarding the frequency spreading to tune a notch filter 402 see FIG. 4) to track, and thus reject, the tone leaked from the SS PLL 210.

Figure 3:
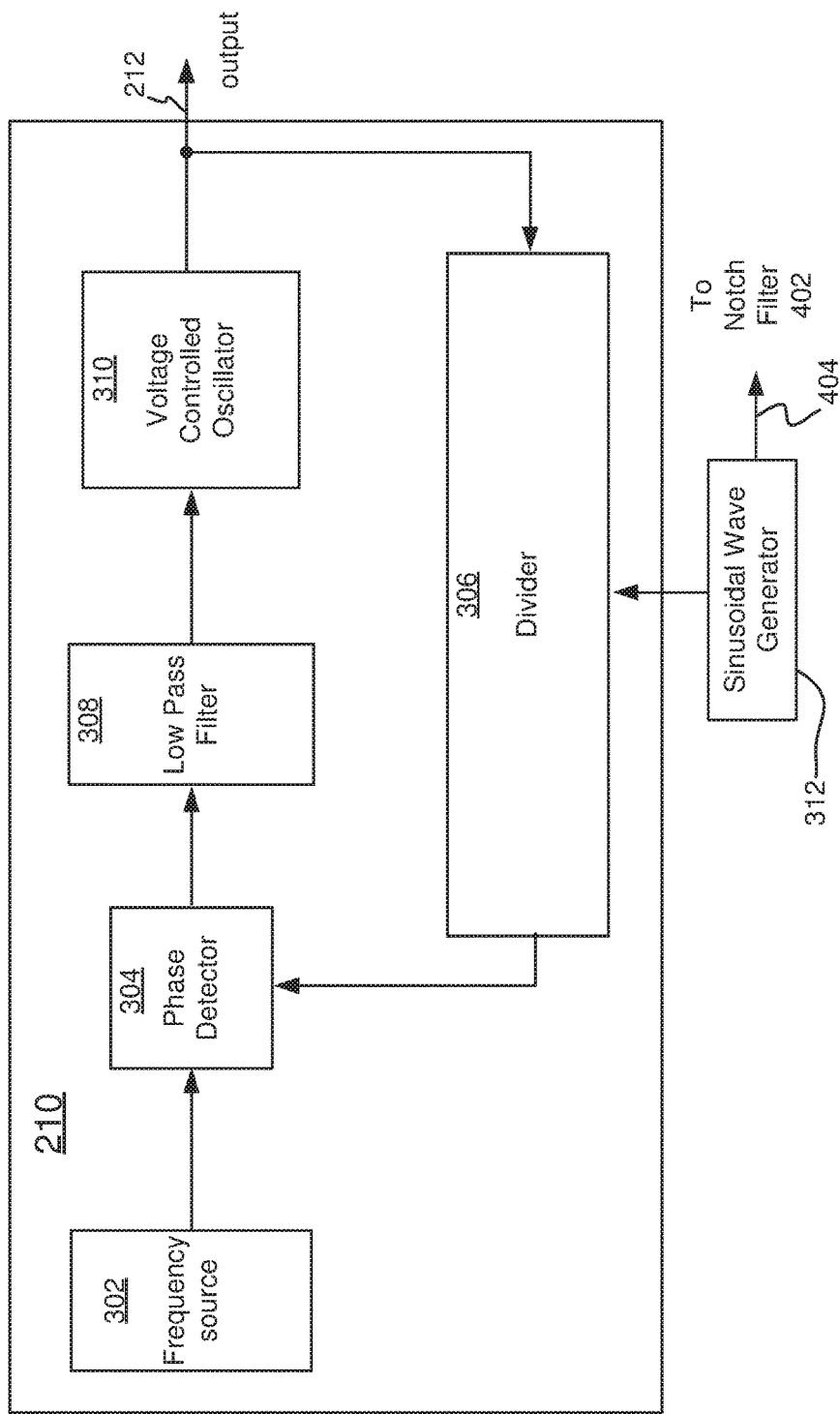
FIG. 3 is a simplified block diagram of a phase lock loop in accordance with one embodiment of the disclosed method and apparatus.

FIG. 3 is a simplified block diagram of a phase lock loop 210 in accordance with embodiment of the disclosed method and apparatus. The phase lock loop 210 operates similarly to the phase lock loop 100 described above. However, a sinusoidal wave generator 312 provides the waveform that is used to spread the frequency of the phase lock loop 210 across the frequency spectrum. The output of the sinusoidal wave generator 312 is coupled to a program input to a programmable divider 306. Accordingly, the signal applied to the signal input of the divider 306 from the output of a VCO 310 will be divided by an amount that varies in response to the sinusoidal wave input to the divider 306 by the generator 312. By spreading the output of the phase lock loop using a sinusoidal wave generator 312, the frequency variations of the phase lock loop 210 can be tracked. That is, the effect of the low pass filter 308 on the sinusoid that is generated by a phase detector 304 will be predictable, since the low pass filter 308 has a relatively predictable response to a sinusoid. The output of the VCO 310 is:

$$e^{j2\pi f(t)} \quad \text{Equation 1:}$$

The ideal spreading function uniformly distributes the frequency over the frequency band of interest:

$$f(t)=[(t \bmod W)-W/2]+f_c; \quad \text{Equation 2:}$$

where $f_c$ is the center frequency of the spreading bandwidth.

The precise impulse response of the low pass filter 308 h(t) to the signal f(t) of Equation 1 is difficult to estimate. The actual output frequency of the VCO 310 after spreading with the spreading function f(t) is:

$$e^{j2\pi h(t)*f(t)}; \quad \text{Equation 3:}$$

where * is the convolution operation.

Small ripples or group delay in the filter response can create an undesirable discrepancy between f(t) and h(t)*f(t). By spreading the output of the phase lock loop 210 with a sinusoidal function, the output of the phase lock loop 210 is more predictable. For example, if:

$$f(t)=A \cos(w \times t)+f_c; \quad \text{Equation 4:}$$

then h(t)*f(t) can be modeled as:

$$h(t)*f(t)=A' \cos(w \times t+\theta)+f_c \quad \text{Equation 5:}$$

Therefore, an estimate of the amplitude and phase can be made to allow a tunable notch filter to track the signal output from the phase lock loop 210 and thus attenuate any energy coupled from the phase lock loop 210 to other circuits.

In one embodiment of the disclosed method and apparatus, the SS PLL 210 is implemented by the DSP 206. However, in an alternative embodiment, the SS PLL 210 is implemented in discrete functional components within the transceiver 200. It will be clear to those skilled in the art that any combination of the DSP 206, a second DSP and hardware used to implement the components of the SS PPL are possible and within the scope of the disclosed method and apparatus.

Figure 4:
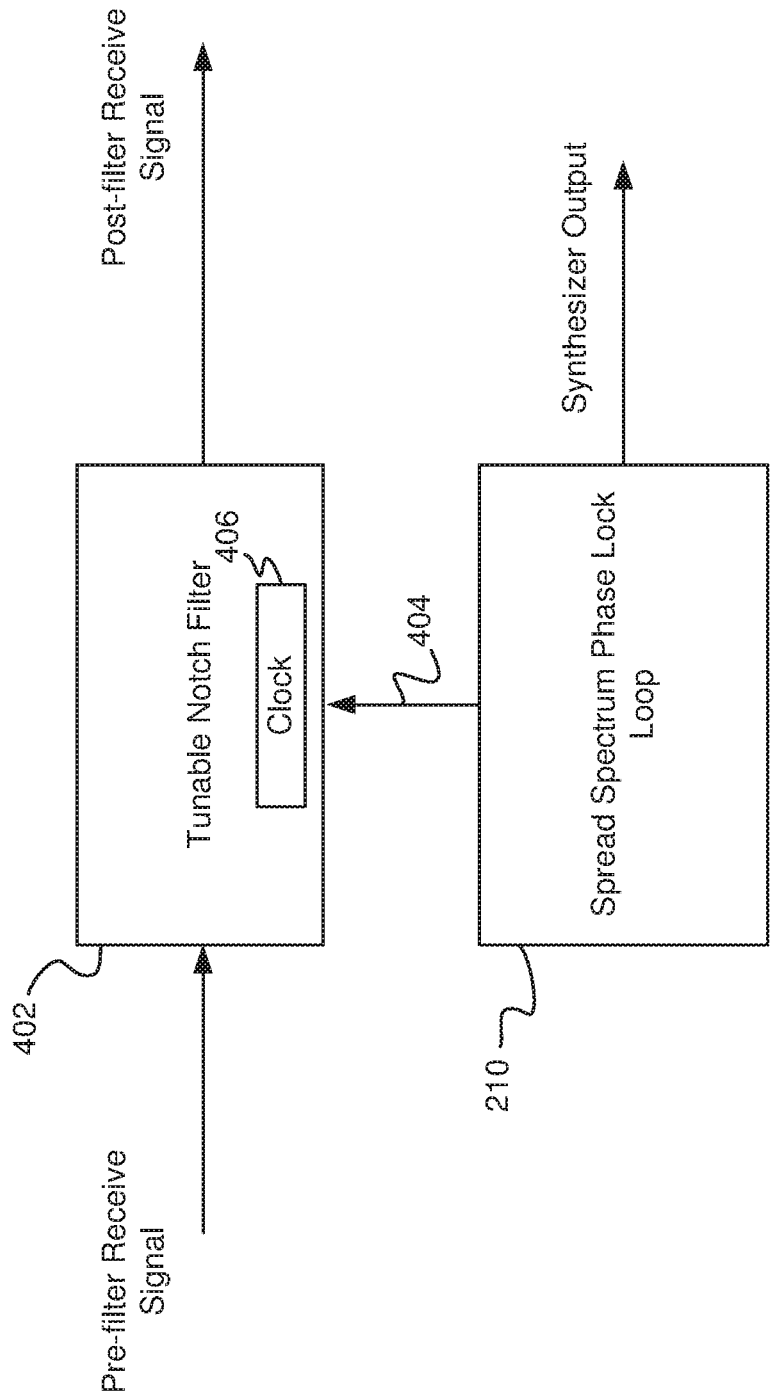
FIG. 4 illustrates the use of a tunable notch filter that is tuned to remove spurious signals generated by the phase lock loop and coupled onto another circuit, such as the receive chain of a transceiver.

FIG. 4 illustrates the use of a tunable notch filter 402 that is tuned to remove spurious signals generated by the phase lock loop 210 and coupled onto another circuit, such as the receive chain of a transceiver 200. In one embodiment of the disclosed method and apparatus, the tunable notch filter 402 is implemented within the DSP 206. As noted above with respect to the SS PPL 210, the notch filter 402 can be implemented alternatively using a second DSP (not shown), or discrete hardware (not shown) within the transceiver 200.

The phase lock loop 210 provides frequency information 404 to a control input of the tunable notch filter 402. The frequency information provides the tunable notch filter 402 with the frequency of the sinusoidal wave that is used to spread the output of the phase lock loop 210. The frequency information is used to steer the frequency of the notch to the frequency of the signal output by the phase lock loop 210. Since the sinusoidal wave used to spread the frequency output of the phase lock loop is relatively undistorted by the low pass filter 308 (See FIG. 3) of the phase lock loop 210, the tunable notch filter 402 can accurately track the frequency output from the phase lock loop 210 based on the frequency information 404. Accordingly, the notch in the filter will track the frequency of the spurious signal to be removed. The fact that the notch filter 402 tracks the signal to be cancelled means that the notch filter 402 can be made narrow. This reduces the amount of desirable in-band energy that is attenuated by the notch filter 402, while at the same time maximizing the amount of interfering energy that is attenuated.

The phase of the signal output from the phase lock loop 210 must be synchronized with the tuning of the notch filter 402. This is accomplished by observing the output of the filter to detect when the spurious signal to be cancelled is at the same frequency as the notch in the notch filter 402. Once the notch in the notch filter 402 and the spurious signal are at the same frequency, the notch filter 402 will track at the frequency indicated by the information signal from the phase lock loop 210. In accordance with one embodiment, the DSP 206 can analyze the output from the notch filter 402 to detect whether the spurious signal generated from leakage of the SS PLL 210 is present. If present, the synchronization of the notch filter 402 can be adjusted by an incremental amount. This process can be repeated iteratively until the proper alignment between the notch filter 402 and the SS PLL 210 is achieved as determined by a reduction in the amount of interference at the SS PLL frequency.

By using a sinusoidal spreading signal to spread the SS PLL 210, the notch filter 402 can accurately track the output of the SS PLL 210 and thus cancel any leakage that is coupled from the SS PLL 210 to other circuits, in accordance with the disclosed method and apparatus, such accurate tracking only requires the frequency used by the SS PLL 210 to spread the signal be provided to the notch filter 402. In one embodiment of the disclosed method and apparatus, a clock 406 is used to control the tracking of the notch filter 402. The output of the clock 406 is synchronized with the same source as the clock used by the sinusoidal wave generator 312 to generate the spreading signal used to spread the SS PLL output. Therefore, the clock 406 used to control the tracking of the notch filter 402 will be phase coherent with the sinusoidal spreading signal used to spread the SS PLL output. Nonetheless, some adjustment to align the filter notch with the interfering signal may be necessary. In one embodiment, the sinusoidal signal output from the sinusoidal wave generator 312 is a series of digital values that each represent the amplitude of a sinusoidal waveform.

Although the disclosed method and apparatus is described above in terms of various examples of embodiments and implementations, it should be understood that the particular features, aspects and functionality described in one or more of the individual embodiments are not limited in their applicability to the particular embodiment with which they are described. Thus, the breadth and scope of the claimed invention should not be limited by any of the examples provided in describing the above disclosed embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A system comprising:
a signal mitigation module; and
a spread spectrum phase lock loop comprising:
a voltage controlled oscillator (VCO);
an adjuster operable to apply an adjustment to an output of the VCO;
a frequency source;
a controller operable to generate control voltage for the VCO based on an output of the frequency source and an output of the adjuster; and
a sinusoidal wave generator operable to generate at least a first output and a second output, wherein the first output is applied to at least one other component of the spread spectrum phase lock loop and the second output is applied to the signal mitigation module;
wherein:
the spread spectrum phase lock loop is operable to generate an output based on at least the output of the VCO; and
the signal mitigation module is operable to process the output of the spread spectrum phase lock loop, based on the second output of the sinusoidal wave generator, to reduce interference.

2. The system of claim 1, wherein the signal mitigation module comprises a tunable notch filter.

3. The system of claim 1, wherein the signal mitigation module is implemented digitally within a digital signal processor (DSP).

4. The system of claim 1, wherein the adjuster comprises a divider that is operable to divide a value of the output of the VCO by a particular value.

5. The system of claim 4, wherein the divider is operable to divide the value of the output of the VCO by a value that varies as a sinusoid.

6. The system of claim 1, wherein at least one output of the sinusoidal wave generator is synchronized to the frequency source.

7. The system of claim 6, wherein the at least one output of the sinusoidal wave generator comprises the first output applied to the at least one other component of the spread spectrum phase lock loop.

8. The system of claim 1, wherein the signal mitigation module is driven by a clock synchronized to the frequency source, the clock being used to control tracking of a tunable notch filter in the signal mitigation module and being controlled by the output of the sinusoidal wave generator.

9. The system of claim 1, wherein at least one output from the sinusoidal wave generator is a series of digital values that each represent an amplitude of a sinusoidal waveform.

10. The system of claim 1, wherein the second output of the sinusoidal wave generator provides information indicating a frequency of a signal corresponding to the first output of the sinusoidal wave generator.

11. The system of claim 10, wherein the information indicating the frequency of the signal corresponding to the first output of the sinusoidal wave generator is used to tune a frequency applicable to the signal mitigation module.

12. The system of claim 1, wherein the spread spectrum phase lock loop is operable to synchronize a phase of the output of the spread spectrum phase lock loop to at least one component of the signal mitigation module.

13. A method comprising:
generating a spread spectrum signal via a spread spectrum phase lock loop, the generating comprising controlling a voltage of a voltage controlled oscillator (VCO) that generates an output corresponding to the spread spectrum signal, wherein the controlling is based on an output of a frequency source and an output corresponding to applying an adjustment to an output of the VCO;
processing the spread spectrum signal to reduce interference caused by the spread spectrum phase lock loop; and
generating via a sinusoidal wave generator at least a first output and a second output, wherein the first output is applied to at least one component of the spread spectrum phase lock loop during generating the spread spectrum signal via the spread spectrum phase lock loop, and the second output is applied during the processing of the spread spectrum signal.

14. The method of claim 13, wherein applying the adjustment to the output of the VCO comprises dividing a value of the output of the VCO.

15. The method of claim 14, comprising dividing the value of the output of the VCO by a value that varies as a sinusoid.

16. The method of claim 13, comprising synchronizing at least one output of the sinusoidal wave generator to the frequency source.

17. The method of claim 13, comprising controlling the processing of the spread spectrum signal based on a clock synchronized to the frequency source.

18. The method of claim 13, comprising tuning a frequency applicable to the processing of the spread spectrum signal based on information indicating a frequency of a signal corresponding to the first output of the sinusoidal wave generator.

19. The method of claim 13, comprising synchronizing a phase of the spread spectrum signal to at least function applied during processing of the spread spectrum signal.

20. The method of claim 19, wherein synchronizing the phase of the spread spectrum signal comprises aligning a spurious signal to be cancelled with a notch frequency of a tunable notch filter utilized in the processing of the spread spectrum signal.

* * * * *